United States Patent [19]

Jung

[11] Patent Number: 5,726,096
[45] Date of Patent: Mar. 10, 1998

[54] METHOD FOR FORMING A TUNGSTEN SILICIDE LAYER IN A SEMICONDUCTOR DEVICE

[75] Inventor: Sung Hee Jung, Seoul, Rep. of Korea

[73] Assignee: Hyundai Electronics Industries Co., Ltd., Kyungki-do, Rep. of Korea

[21] Appl. No.: 654,003

[22] Filed: May 28, 1996

Related U.S. Application Data

[63] Continuation of Ser. No. 357,313, Dec. 16, 1994, abandoned.

[30] Foreign Application Priority Data

Dec. 17, 1993 [KR] Rep. of Korea .................. 93 28140

[51] Int. Cl.$^6$ .................................. H01L 21/28
[52] U.S. Cl. ............... 438/592; 438/655; 438/657; 438/680
[58] Field of Search ......................... 457/193, 200, 457/245, 246; 427/588; 458/592, 647, 649, 655, 657, 680

[56] References Cited

U.S. PATENT DOCUMENTS 5,231,056  7/1993  Gurtej .
5,364,803  11/1994  Lur et al. ........................ 437/200

*Primary Examiner*—John Niebling
*Assistant Examiner*—Thomas G. Bilodeau
*Attorney, Agent, or Firm*—Fish & Richardson P.C.

[57] ABSTRACT

The present invention discloses a method for forming a tungsten silicide layer in a semiconductor device. A wafer to be deposited with a tungsten silicide layer is loaded into a chamber. The tungsten silicide layer is primarily deposited, thinner than desired in the device by a Chemical Vapor Deposition utilizing $WF_6$ and $SiH_4$ gases. The fluorine contained in the primarily deposited tungsten silicide layer is removed by introducing a large quantity of $SiH_4$ gas into the chamber. Again the tungsten silicide layer is secondarily deposited, thinner than desired in the device, on the tungsten silicide layer from which the fluorine is removed and, thereafter, the fluorine contained in the secondarily deposited tungsten silicide layer is removed by introducing a large quantity of $SiH_4$ gas. Such a process is repeated until the tungsten silicide layer of the thickness desired in the device is deposited. Accordingly, the present invention can increase the reliability of the semiconductor device by removing defect factors which appear during a later process as a result of fluorine ions contained in the tungsten silicide layer.

2 Claims, 1 Drawing Sheet

5,726,096

METHOD FOR FORMING A TUNGSTEN SILICIDE LAYER IN A SEMICONDUCTOR DEVICE

This application is a continuation of U.S. application Ser. No. 08/357,313, filed Dec. 16, 1994, now abandoned.

FIELD OF THE INVENTION

The present invention relates to a method for forming a tungsten silicide layer in a semiconductor device, and more particularly, to a method for forming a tungsten silicide layer in a semiconductor device which can increase the reliability of the semiconductor by removing fluorine atoms incorporated into a tungsten silicide layer by introducing $SiH_4$ gas or hydro compounds repeatedly in regular intervals during the deposition of the tungsten silicide layer.

INFORMATION DISCLOSURE STATEMENT

In general, to improve the electrical characteristics of a conductive layer such as a gate electrode, a polycide gate structure composed of a polysilicon layer and a tungsten silicide layer is used for the gate electrode. The tungsten silicide layer is formed on polysilicon layer in one process of deposition by loading a wafer into a chamber and by depositing, with the temperature of the chamber at 350–°450° C. and the atmospheric pressure at a constant ratio of $WF_6$ and $SiH_4$. $WF_6$ and $SiH_4$ are the primary reaction gases employed in the deposition of the tungsten silicide layer. A large number of fluorine atoms are incorporated (approximately $10^{20}$ ion/cm$^3$) in to the formed tungsten silicide layer due to the $WF_6$, and these fluorine ions diffuse and penetrate into a gate oxide film during the heating process. Thus the thickness of the gate oxide film is increased, and problems may occur—that is, an electron trap may form in the gate oxide film or the yield and reliability of the device may be aggravated due to a change in threshold voltage.

Conventionally in the prior art, a method for increasing the deposition temperature or the amount of $SiH_4$ gas has been used to reduce the fluorine ions contained in the tungsten silicide layer. However, there is a drawback in that the resistance of the tungsten silicide layer formed by such methods is increased.

SUMMARY OF THE INVENTION

Therefore, the object of the present invention is to provide a method for forming a tungsten silicide layer in a semiconductor device to improve the yield and reliability of the semiconductor device by removing fluorine ions contained in the tungsten silicide layer by repeatedly performing a treatment which utilizes $SiH_4$ or hydro compounds in a chamber during the tungsten silicide layer deposition process, to solve the above-mentioned problems.

The process for forming a tungsten silicide layer of the present invention for achieving the object comprises of the following steps: loading a wafer on which a polysilicon layer is formed into a chamber, and thereafter primarily depositing the tungsten silicide layer, thinner than desired in the device, on the polysilicon layer by a Chemical Vapor Deposition utilizing $WF_6$ and $SiH_4$ gases at a temperature of about 350°–450° C.; removing fluorine contained in the primarily deposited tungsten silicide layer by introducing $SiH_4$ gas or hydride into the chamber; and sequentially repeating a process of secondarily depositing the tungsten silicide layer, thinner than desired in the device, on the tungsten silicide layer from which the fluorine is removed and a process of removing the fluorine contained in the secondarily deposited tungsten silicide layer by introducing $SiH_4$ gas or a hydro compound until the tungsten silicide layer, of the thickness desired in the device, is deposited.

BRIEF DESCRIPTION OF THE DRAWINGS

To better understand the nature and object of the present invention, reference should be made to the following detailed descriptions taken in conjunction with the accompanying drawings in which.

Similar reference characters refer to similar parts through the several views of the drawings.

DETAILED DESCRIPTION OF THE INVENTION

Figure 1A:
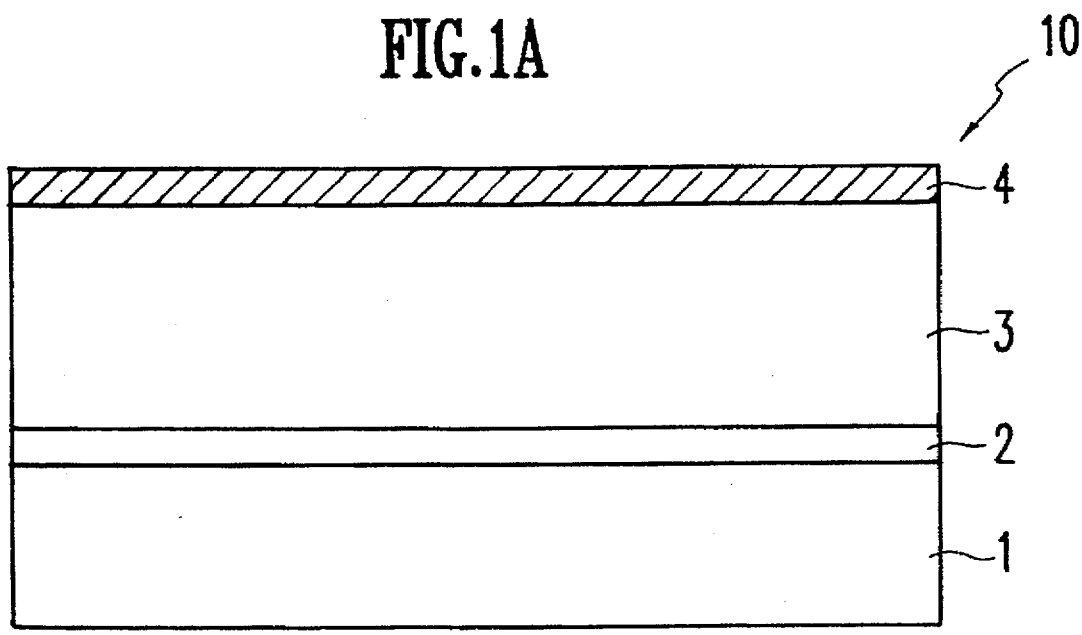
FIG. 1A and 1B shows sectional views to illustrate steps for forming a tungsten silicide layer in the semiconductor device of the present invention.
Figure 1B:
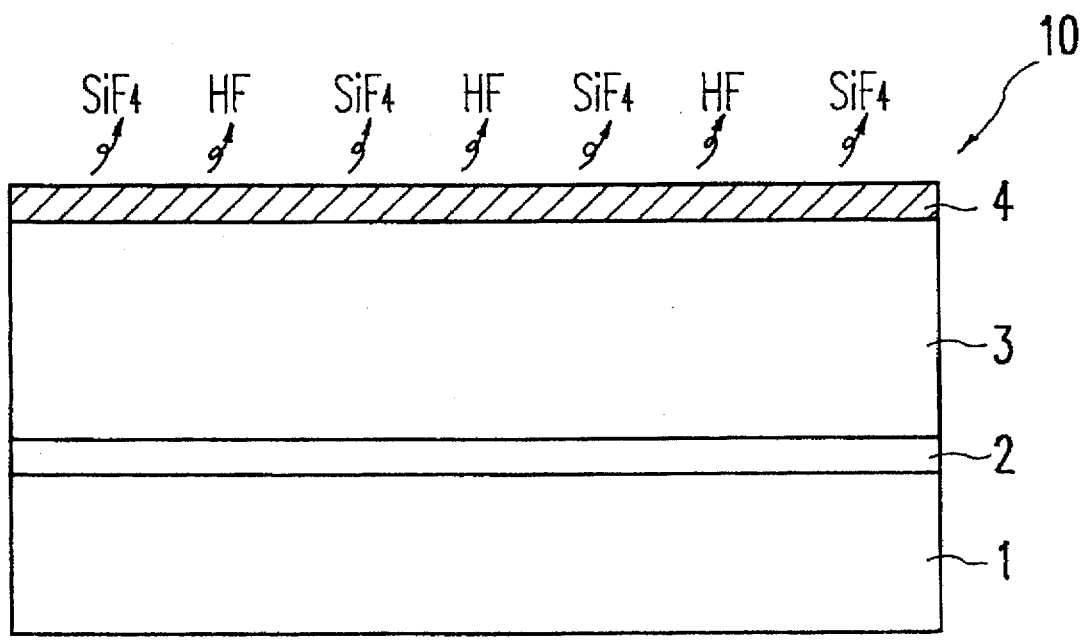

FIGS. 1A and 1B are sectional views illustrating the steps for forming a tungsten silicide layer in the semiconductor device of the present invention.

Referring to FIG. 1A, a gate oxide film 2 and a polysilicon layer 3 are sequentially deposited on a wafer 1. The wafer 1 is loaded in a chamber and, thereafter, a tungsten silicide layer 4 is formed on the polysilicon layer 3, substantially thinner than desired in the device, by a Chemical Vapor Deposition utilizing $WF_6$ and $SiH_4$ as an atmospheric pressure and with the temperature of the chamber at 350°–450° C.

Referring to FIG. 1B, $WF_6$ and $SiH_4$ which are introduced into the chamber are cut off. A large number of fluorine atoms are incorporated into the primary tungsten silicide layer 4 during the deposition process. To remove the fluorine atoms incorporated into the primary tungsten silicide layer 4, $SiH_4$ of a hydride is introduced into the chamber. The fluorine atoms incorporated into the primary tungsten silicide layer 4 are removed in gas state of HF or $SiF_4$ by making silicon atoms or hydrogen atoms of $SiH_4$ gas or hydrogen atoms of hydro compound react with fluorine atoms. the formed $SiH_4$ or hydride which is introduced into the chamber are cut off. An additional tungsten silicide layer (not shown) is deposited on the primary tungsten silicide layer 4 to a certain thickness utilizing the same method as the process in FIG. 1A and, thereafter, the fluorine atoms are removed from the additional tungsten silicide layer containing the fluorine atoms by reintroducing $SiH_4$ gas or hydrido compound into the chamber. A final tungsten silicide layer of the thickness desired in the device is formed on the polysilicon layer 3 by repeating such processes as FIG. 1A and 1B.

The $SiH_4$, introduced to remove the fluorine atoms according to the present invention, is introduced to the fullest possible extent within a range allowed by the capacity of the mass flow controller(MFC) in consideration of a specific resistance. The chamber at the time of introduction of $SiH_4$ gas is maintained at the same temperature and pressure as during deposition of the tungsten silicide layer.

The problem with the prior art—of the increase in resistance due to the increase in $SiH_4$ gas—is solved by primarily thinly depositing the tungsten silicide layer in a previously existed gas ratio of $WF_6$ and $SiH_4$ rather than instead of depositing the tungsten silicide layer in a condition in which the depositing temperature or the amount of $SiH_4$ gas increases to prevent the increase in resistance, thereafter removing fluorine atoms by introducing $SiH_4$ gas or hydrido compound into the chamber, and forming the final tungsten silicide layer by repeating the process of secondarily depositing the tungsten silicide layer at the same gas ratio of $WF_6$ and $SiH_4$.

The present invention described above can prevent the aggravation of the gate characteristics due to the penetration of fluorine atoms during the heat treatment process, which is a later process, because the tungsten silicide layer is deposited under an optimum condition of gas ratio of $WF_6$ or HF gas every time the tungsten silicide layer is deposited in a certain thickness by repeating the $SiH_4$ treatment during the deposition process, and also can increase the yield and reliability of the semiconductor device because the increase in resistance can be prevented by depositing the tungsten silicide layer to maintain the optimum condition of the gas ratio of $WF_6$ and $SiH_4$, the deposition temperature, and pressure.

Although this invention has been described in its preferred form with a certain degree of particularity, it is appreciated by those skilled in the art that the present disclosure of the preferred form has been made only as an example and that numerous changes in the details of the construction, combination and arrangement of its parts may be resorted to without departing from the spirit and scope of the invention.

What is claimed is:

1. A method for forming a tungsten silicide layer having a first thickness in a semiconductor device, comprising the following steps of:
   (a) loading a wafer having a polysilicon layer thereon into a chamber and depositing a primary tungsten silicide layer on said polysilicon layer by a Chemical Vapor Deposition (CVD) utilizing reaction gases comprising $WF_6$ and $SiH_4$;
   (b) removing fluorine atoms contained in said primary tungsten silicide layer by introducing $SiH_4$ gas into said chamber after said reaction gases are cut off;
   (c) depositing an additional tungsten silicide layer on said primary tungsten silicide layer by reintroducing said reaction gases into said chamber after said $SiH_4$ gas is cut off; and
   (d) removing fluorine atoms contained in said additional tungsten silicide layer by reintroducing said $SiH_4$ gas into said chamber, wherein (c) and (d) are sequentially repeated until a tungsten silicide layer having a first thickness is formed on said polysilicon layer.

2. A method for forming a tungsten silicide layer in a semiconductor device as claimed in claim 1, said fluorine atoms are removed in the form of HF or $SiF_4$ gas by combining with silicon atoms or hydrogen atoms with the aid of said $SiH_4$ gas.

\* \* \* \* \*